United States Patent [19]
Gardner et al.

[11] Patent Number: 6,040,207
[45] Date of Patent: Mar. 21, 2000

[54] OXIDE FORMATION TECHNIQUE USING THIN FILM SILICON DEPOSITION

[75] Inventors: Mark I. Gardner, Cedar Creek; Mark C. Gilmer, Austin, both of Tex.

[73] Assignee: Advanced Micro Devices, Inc., Sunnyvale, Calif.

[21] Appl. No.: 09/189,278

[22] Filed: Nov. 10, 1998

Related U.S. Application Data

[62] Division of application No. 08/812,740, Mar. 6, 1997.

[51] Int. Cl.$^7$ ................................................ H01L 21/316
[52] U.S. Cl. ...................... 438/216; 438/264; 438/287; 438/762; 438/703; 438/770
[58] Field of Search .................................. 438/770, 762, 438/703, 216, 264, 261, 287

[56] References Cited

U.S. PATENT DOCUMENTS

| | | |
|---|---|---|
| 4,098,618 | 7/1978 | Crowder et al. . |
| 4,551,910 | 11/1985 | Patterson . |
| 4,682,407 | 7/1987 | Wilson et al. . |

(List continued on next page.)

FOREIGN PATENT DOCUMENTS

| | | |
|---|---|---|
| 0216246 | 4/1987 | European Pat. Off. . |
| 0532260 | 3/1993 | European Pat. Off. . |
| 3032608 | 3/1981 | Germany . |
| 5-283678 | 10/1993 | Japan . |

OTHER PUBLICATIONS

Naito et al., "Effect of Bottom Oxide on the Integrity of Interpolysilicon Ultrathin ONO Films," *Journal of the Electrochemical Society*, vol. 137, No. 2, Feb. 1, 1990, pp. 635–638.

Cheung, "Plasma Immersion Ion Implantation for ULSI Processing," *Trends & Applications*, 1991, pp. 811–820.

Wolf et al., "Silicon Processing for the VLSI Era, vol. 1, Process Technology," pp. 198–218.

Patent Abstracts of Japan, Publication No. 01183844, Publication Date Jul. 21, 1989, Application Date Jan. 19, 1988, Application No. 63008901.

Scott et al., "Blocking of Silicon Oxidation by Low–Dose Nitrogen Implantation," *Applied Physics A/Solids & Surfaces*, vol. A45, No. 1, Jan. 1, 1988, pp. 73–76.

Wolf et al., "Silicon Processing for the VLSI Era, vol. 1, Process Technology," p. 321.

Molle et al., "Nitrogen Implantation for Local Oxidation of Silicon," *Nuclear Instruments & Methods in Physics Research, Section B*, vol. B55, Nos. 1, 4, Apr. 2, 1991, pp. 860–865.

(List continued on next page.)

Primary Examiner—Charles Bowers
Assistant Examiner—Matthew Whipple
Attorney, Agent, or Firm—Kevin L. Daffer; Conley, Rose & Tayon

[57] ABSTRACT

A semiconductor process in which a silicon film is chemically vapor deposited upon a native oxide film as part of the gate oxide formation process. The invention contemplates a method of forming a thin gate dielectric semiconductor transistor. A semiconductor substrate which includes a native oxide film on an upper region of a silicon bulk is provided and a silicon film is deposited on the native oxide film. A first oxide film is then formed on a the native oxide film by thermally oxidizing a portion of the silicon film proximal to the native oxide film such that the thin gate dielectric comprises the native oxide film and the first oxide film. Thereafter, a conductive gate is formed on the thin gate dielectric and a pair of source/drain structures are formed within a pair of source/drain regions of the semiconductor substrate. The pair of source/drain structures are laterally displaced on either side of the channel region of the semiconductor substrate. In one embodiment the process further includes the step, prior to the formation of the first oxide layer, of thinning the silicon layer by removing an upper portion of the silicon layer. In one embodiment, a barrier dielectric is deposited on an upper surface of the silicon film prior to the step of forming the first oxide film. In still another embodiment, the process further includes the step of depositing a barrier dielectric after the formation of the first oxide film and prior to the formation of the conductive gate.

11 Claims, 3 Drawing Sheets

U.S. PATENT DOCUMENTS

| | | | |
|---|---|---|---|
| 4,707,721 | 11/1987 | Ang et al. | 357/54 |
| 4,729,009 | 3/1988 | Ang . | |
| 4,737,474 | 4/1988 | Price | 437/200 |
| 4,774,197 | 9/1988 | Haddad et al. . | |
| 4,776,925 | 10/1988 | Fossum et al. . | |
| 4,808,261 | 2/1989 | Ghidini et al. . | |
| 4,851,257 | 7/1989 | Young et al. . | |
| 4,866,002 | 9/1989 | Shizukuishi et al. . | |
| 4,922,319 | 5/1990 | Fukushima . | |
| 5,043,780 | 8/1991 | Fazan et al. . | |
| 5,066,995 | 11/1991 | Young et al. . | |
| 5,082,797 | 1/1992 | Chan et al. . | |
| 5,102,832 | 4/1992 | Tuttle . | |
| 5,138,411 | 8/1992 | Sandhu . | |
| 5,172,200 | 12/1992 | Muragishi et al. . | |
| 5,191,509 | 3/1993 | Wen . | |
| 5,208,176 | 5/1993 | Ahmad et al. . | |
| 5,250,456 | 10/1993 | Bryant . | |
| 5,254,489 | 10/1993 | Nakata . | |
| 5,286,992 | 2/1994 | Ahrens et al. . | |
| 5,308,787 | 5/1994 | Hong et al. . | |
| 5,330,920 | 7/1994 | Soleimani et al. . | |
| 5,330,935 | 7/1994 | Dobuzinsky et al. . | |
| 5,340,764 | 8/1994 | Larsen et al. . | |
| 5,358,894 | 10/1994 | Fazan et al. . | |
| 5,371,028 | 12/1994 | Koh | 437/43 |
| 5,429,966 | 7/1995 | Wu | 437/43 |
| 5,432,114 | 7/1995 | O . | |
| 5,480,828 | 1/1996 | Hsu et al. . | |
| 5,502,009 | 3/1996 | Lin . | |
| 5,576,226 | 11/1996 | Hwang . | |
| 5,576,266 | 11/1996 | Flosenzier et al. . | |
| 5,576,570 | 11/1996 | Ohsawa et al. . | |
| 5,597,756 | 1/1997 | Fazan | 437/52 |
| 5,780,342 | 7/1998 | Wang | 438/260 |
| 5,940,736 | 8/1999 | Brady | 438/787 |

OTHER PUBLICATIONS

Kuroi et al., "Novel NICE Structure for High Reliability and High Performance 0.25 micron Dual Gate CMOS," *IEDM,* pp. 325–328.

Ahn et al., "High Quality Ultrathin Gate Dielectrics Formation by Thermal Oxidation of Si in $N_2O$," *J. Electrochem. Soc.,* vol. 138, No. 9, Sep. 1991, pp. L39–L41.

Doyle et al., "Simultaneous Growth of Different Thickness Gate Oxides in Silicon CMOS Processing," *IEEE Electron Device Letters,* vol. 16, No. 7, Jul. 1995, pp. 301–302.

Philipossian et al., "Kinetics of Oxide Growth during Reoxidation of Lightly Nitrided Oxides," *J. Electrochem. Soc.,* vol. 139, No. 9, Sep. 1992, pp. L82–L83.

Abbas et al., "Improvement of the Gate–Region Integrity in FET Devices," *IBM Technical Disclosure Bulletin,* vol. 14, No. 11, Apr. 1972, pp. 3348–3350.

OXIDE FORMATION TECHNIQUE USING THIN FILM SILICON DEPOSITION

This is a Division of application Ser. No. 08/812,740, filed Mar. 6, 1997.

BACKGROUND OF THE INVENTION

1. Field of the Invention

The invention relates to the field of semiconductor processing and more particularly to a process of forming a thin gate dielectric for an MOS transistor.

2. Description of the Relevant Art

The basic MOS transistor is a well known electronic device which typically includes four terminals: the gate, source, drain, and substrate. The substrate terminal of n-channel MOS transistor is typically biased to the most negative voltage that the device is likely to encounter during circuit operation to prevent forward biasing of pn junctions formed within the substrate during circuit fabrication. In the most common MOS transistor configuration, the gate terminal functions as the device input by dictating the absence or presence of a conductive path between the source and drain terminals. When the gate voltage exceeds the source voltage by a threshold value ($V_T$), current can flow freely from source to drain (or from drain to source) upon application of a potential difference between the two output terminals. When an MOS transistor is biased in a saturated condition (i.e., $V_{gs} \geq V_T$ and $V_{ds} \geq V_{gs}$), the drain current $i_{ds}$ is, to a first order approximation, independent of the drain voltage. The current that flows under such conditions is referred to as the saturated drain current, $I_{dsat}$. $I_{dsat}$ is typically calculated by biasing the gate and drain to a maximum operating voltage (e.g., 3 V), grounding the source and substrate terminals, and measuring the current $i_{ds}$ flowing between the source and drain terminals. $I_{dsat}$ is an indicator of the potential speed of an integrated circuit and is an important process parameter and, thus, maximizing $I_{dsat}$ is a desirable goal in any process design. A useful estimate of $I_{dsat}$ is provided by the expression:

$$I_{dsat} \approx \frac{1}{2} (W/L) \mu_n C_{ox} (V_{DS})^2$$

where W/L is the ratio of the transistor channel width to length, $\mu_n$ is the carrier mobility, $C_{ox}$ is the capacitance per unit area of the gate dielectric structure, and $V_{DS}$ is the potential difference between the source and drain terminals. The equation reveals that $I_{dsat}$ varies proportionally with the capacitance per unit area $C_{ox}$ where $C_{ox} = \epsilon_i / t_{ox}$, $\epsilon_i$ is the permittivity of the gate dielectric material and $t_{ox}$ is the dielectric thickness. From these equations it is apparent that reducing the gate oxide thickness $t_{ox}$ increases a saturated drain current $I_{dsat}$. Because it is typically desirable to increase the saturated drain current $I_{dsat}$, it is frequently desirable and necessary to reduce the thickness $t_{ox}$ of the gate dielectric.

Reducing the gate oxide thickness is conventionally accomplished by simply reducing the time of the thermal oxidation process. This method of reducing gate oxide thickness may be sufficient in applications where the gate oxide thickness is in excess of approximately 50 angstroms but becomes ineffective for extremely thin gate oxides (i.e., gate oxides less than 50 angstroms in thickness). For ultra thin gate oxides, the gate oxidation rate for the typical thermal process used to form the gate oxide is too great to achieve adequate control over variations in gate oxide thickness from run to run.

In addition, the typical gate oxide consists of a silicon-oxide composite such as thermal silicon dioxide which has a dielectric constant in the range of approximately 3.8 to 3.9. In ultra thin oxide applications, this dielectric constant, which directly affects the capacitance per unit area of the gate dielectric, is insufficient to ensure an adequate saturated drain current. Moreover, the silicon-oxide composite is typically insufficient as a barrier dielectric against mobile impurities that are frequently found in the conductive gate structures of semiconductor transistors. The problem of migrating mobile impurities is typically greatest in ultra thin oxide applications in which the conductive gate structure includes highly mobile impurities such as boron. Boron and other impurities from within the gate structure can migrate across the thin gate oxide and come to rest in the active area of the transistor channel region thereby inadvertently and undesirably altering the threshold voltage of the device.

It is therefore desirable to implement a process that is capable of producing ultra thin oxides with adequate control over the oxide thickness variation from run to run and that may result in an increased gate oxide capacitance per unit area while simultaneously reducing or eliminating the occurrence of mobile carriers and other impurities migrating across the gate dielectric structure.

SUMMARY OF THE INVENTION

The problems identified above are in large part addressed by a semiconductor process in which a silicon film is chemically vapor deposited upon a native oxide film as part of the gate oxide formation process. The silicon deposition advantageously permits control over the film thickness to within a few angstroms. In addition, the silicon film may be subsequently oxidized thereby permitting a silicon oxide film with an extremely controllable final film thickness. The silicon film may be covered by a silicon nitride film prior to or subsequent to the thermal oxidation of the silicon film to introduce a barrier layer into the gate dielectric structure. The use of silicon nitride is desirable as a method of reducing the penetration of mobile impurities across the gate dielectric structure resulting in a more reliable process. In addition, it is theorized that the comparatively high dielectric constant of silicon nitride may desirably increase the overall capacitance per unit area of the hybrid gate dielectric structure potentially resulting in an increased saturated drain current over the drain current of a comparably sized gate dielectric transistor that consists essentially of silicon dioxide.

Broadly speaking, the invention contemplates a method of forming a thin gate dielectric semiconductor transistor. A semiconductor substrate which includes a native oxide film on an upper region of a silicon bulk is provided and a silicon film is deposited on the native oxide film. A first oxide film is then formed on the native oxide film by thermally oxidizing a portion of the silicon film proximal to the native oxide film such that the thin gate dielectric comprises the native oxide film and the first oxide film. Thereafter, a conductive gate is formed on the thin gate dielectric and a pair of source/drain structures are formed within a pair of source/drain regions of the semiconductor substrate. The pair of source/drain structures are laterally displaced on either side of the channel region of the semiconductor substrate. Preferably, the semiconductor substrate comprises single crystal silicon and still more preferably comprises a p-type epitaxial layer formed on a p+ silicon bulk. A preferred resistivity of the p-type epitaxial layer is in the range of approximately 10 to 15 Ω-cm. The deposition of the silicon film preferably includes a thermal decomposition of silane in a CVD reactor maintained at a temperature in the range of approximately 500° C. to 650° C. at a pressure less than approximately 2 torrs. In a presently preferred embodiment, the rate at which the silicon is deposited in the deposition step is in the range of approximately 5 to 15 angstroms per minute to permit adequate final film thickness control to within a few angstroms. Preferably, the silicon film deposition results in undoped silicon film.

In one embodiment the process further includes the step, prior to the formation of the first oxide layer, of thinning the silicon layer by removing an upper portion of the silicon layer. Preferably the thinning of the silicon layer is achieved by oxidizing an upper portion of the silicon film to form a sacrificial oxidized film and thereafter removing the sacrificial oxidized film with an oxide etch process. In one embodiment, a barrier dielectric is deposited on an upper surface of the silicon film prior to the step of forming the first oxide film. In this embodiment, the barrier dielectric substantially prevents subsequent oxidation of the silicon film at an interface of the barrier dielectric film and the silicon film. In this embodiment, the thin gate dielectric includes the native oxide film, the first oxide film, and the barrier dielectric. The formation of the barrier dielectric typically comprises the step of depositing silicon nitride. In still another embodiment, the process includes the step of depositing a barrier dielectric after the formation of the first oxide film and prior to the formation of the conductive gate.

The present invention further contemplates a semiconductor transistor. The transistor includes a semiconductor substrate, a gate dielectric, a conductive gate, and a pair of source/drain structures. The gate dielectric includes a gate oxide layer formed on an upper surface of the semiconductor substrate and a gate nitride layer formed above an upper surface of the gate oxide layer. The conductive gate is formed on an upper surface of the gate nitride layer. The pair of source/drain structures are formed within a pair of source/drain regions of the semiconductor substrate laterally displaced on either side of a channel region of the semiconductor substrate. In one preferred embodiment, the thickness of the gate dielectric layer is less than approximately 100 angstroms. Still more preferably, a thickness of the gate dielectric layer is in the range of approximately 10 to 30 angstroms. In one embodiment, the gate dielectric further includes a silicon layer formed between the oxide layer and the silicon nitride layer. In this embodiment, the silicon layer preferably comprises undoped silicon. In one embodiment of the present invention, the gate oxide layer includes a first oxide layer formed on a native oxide layer.

BRIEF DESCRIPTION OF THE DRAWINGS

Other objects and advantages of the invention will become apparent upon reading the following detailed description and upon reference to the accompanying drawings in which.

Figure 1:
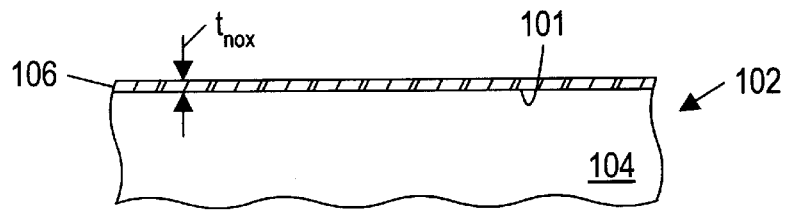
FIG. 1 is a partial cross-sectional view of a semiconductor substrate on which a native oxide layer resides.

While the invention is susceptible to various modifications and alternative forms, specific embodiments thereof are shown by way of example in the drawings and will herein be described in detail. It should be understood, however, that the drawings and detailed description thereto are not intended to limit the invention to the particular form disclosed, but on the contrary, the intention is to cover all modifications, equivalents, and alternatives falling within the spirit and scope of the present invention as defined by the appended claims.

DETAILED DESCRIPTION OF THE DRAWINGS

Turning now to the drawings, FIG. 1 shows a partial cross sectional view of semiconductor substrate 104 including native oxide layer 106 formed on an upper surface 101 of the semiconductor substrate. Preferably, the semiconductor substrate 104 comprises monocrystal silicon. In a presently preferred embodiment, semiconductor substrate 104 includes a p-type epitaxial layer formed over a p+ silicon bulk. A preferred resistivity of the p-type epitaxial layer is in the range of approximately 10 to 15 $\Omega$-cm. The p+ silicon bulk preferably includes an impurity distribution containing boron ions in excess of approximately $10^{19}$ atoms/cm$^3$. Native oxide film 106 is a naturally occurring film that typically forms whenever semiconductor substrate 104 is exposed to atmosphere. Native oxide 106 is typically comprised of silicon and oxide. Conventionally, native oxide film 106 has a thickness $t_{nox}$ in the range of approximately 5 to 15 angstroms. Conventional gate oxidation processes typically attempt to form the gate dielectric by immersing the semiconductor substrate into an oxygen bearing heated ambient. Control of the final thickness of the gate dielectric using these conventional techniques becomes difficult in the sub-50 angstrom regime. The insertion and removal of a semiconductor substrate from a conventional oxidation tube is generally accompanied by unwanted thermal oxidation and results in inadequate control over the final film thickness. The present invention contemplates the deposition of a silicon film and the subsequent oxidation of the silicon film to maintain adequate control over the final gate dielectric thickness.

Figure 2:
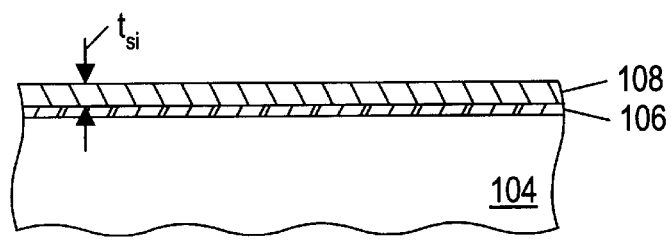
FIG. 2 is a processing step subsequent to FIG. 1 in which a silicon layer has been formed on the native oxide layer.

Turning to FIG. 2, a silicon layer 108 is deposited upon native oxide film 106. Preferably, silicon layer 108 is comprised of chemically vapor deposited silicon. As is well known by those in the semiconductor processing field, the deposition rate of CVD silicon films can be controllably maintained down to levels in the range of approximately 5 to 15 angstroms/minute thereby allowing for extremely precise control over the final film thickness. In one embodiment, the deposition of silicon film 108 is achieved using a chemical vapor deposition chamber reactor maintained at a temperature in the range of approximately 500° C. to 650° C. and a pressure of less than approximately 2 torr. Increased control over the deposition rate and final film thickness can be achieved by decreasing the ambient temperature within the deposition chamber. In one embodiment, the silicon deposition rate is in the range of approximately 5 to 15 angstroms per minute. At deposition rates this low, the final film thickness can be accurately controlled to within 2 angstroms. The silicon film is preferably undoped. Undoped silicon exhibits a high resistivity and serves as a dielectric in embodiments of the present invention in which the silicon film is not completely oxidized or otherwise removed. The incorporation of a thin silicon film into the gate dielectric structure in these embodiments of the present invention may beneficially increase the overall capacitance per unit area of the gate dielectric because of the higher dielectric constant of silicon compared to silicon oxide structures. In the preferred embodiment, a thickness $t_{si}$ of silicon layer 108 is preferably in the range of approximately 15 to 25 angstroms.

Figure 3:
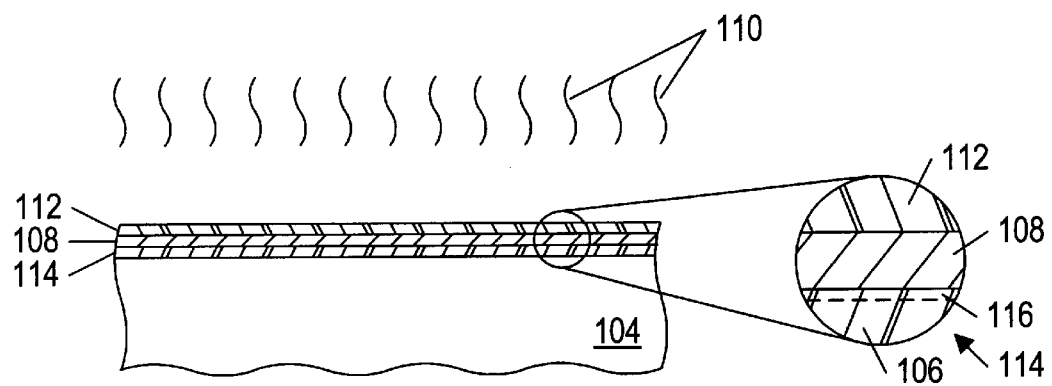
FIG. 3 is a processing step subsequent to FIG. 2 in which the silicon layer has been partially thermally oxidized.

Turning to FIG. 3, a first oxide film 116 is formed on native oxide film 106 with thermal oxidation process 110. Preferably, thermal oxidation 110 includes immersing semiconductor substrate 104 into an oxygen bearing ambient maintained at a temperature in the range of approximately 800° C. to 1000° C. Oxygen from the oxygen bearing ambient combines with the silicon film upper surface to form sacrificial oxide layer 112. In addition, a percentage of the oxygen atoms are believed to migrate through silicon film 108 to form an additional oxide layer, referred to herein as first oxide layer 116, at an interface between silicon film 108 and native oxide film 106. In an embodiment not shown in the drawings, silicon film 108 may be thinned prior to thermal oxidation 110 by executing a silicon etch process prior to thermal oxidation 110. Alternatively, the thinning of silicon film 108 may be accomplished by thermally oxidizing an upper portion of silicon film 108 and then removing this thermal oxide with a conventional oxide removal solution such as buffered HF. Thermal oxidation 110 results in a thinning of silicon layer 108 and a corresponding thickening of gate oxide 114. The presence of the silicon film and sacrificial oxide layer 112 reduce the oxidation rate at the silicon/native oxide interface thereby resulting in a highly controllable growth rate for first oxide layer 116. Using this technique, the final film thickness of gate oxide 114 which includes native oxide film 106 and first oxide film 116 can be accurately maintained within approximately 2 angstroms.

Figure 4A:
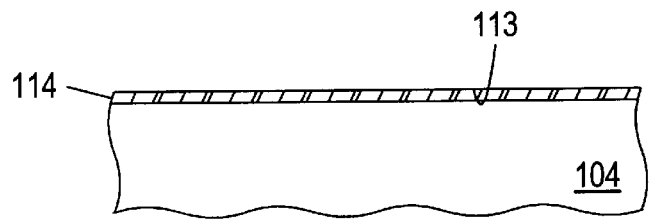
FIG. 4a is a processing step subsequent to FIG. 4b in which the sacrificial oxide layer and the silicon layer have been removed.
Figure 4B:
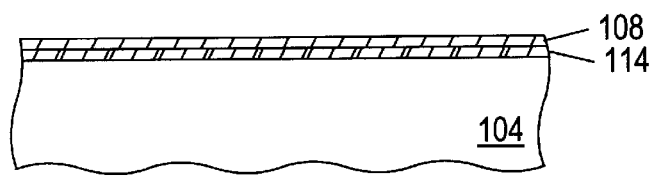
FIG. 4b is an alternative processing step subsequent to FIG. 3 in which the sacrificial oxide layer has been removed but the silicon layer remains.

Turning now to FIGS. 4a and 4b, alternative embodiments of the present invention are contemplated. In FIG. 4a, sacrificial oxide layer 112 and silicon layer 108 are entirely removed from upper surface 113 of gate oxide 114. In the alternative embodiment shown in FIG. 4b, the sacrificial oxide film 112 has been removed but silicon film 108 remains. In this embodiment, silicon film 108 will form a portion of the final gate dielectric 121. In this embodiment, the capacitance per unit area of the composite gate dielectric may be increased due to the higher dielectric constant of silicon with respect to silicon oxides. Because silicon film 108 is preferably comprised of undoped silicon, it is not highly conductive as are the polysilicon films typically found in the gate structures of MOS transistors. The undoped silicon film may thus serve adequately as an additional dielectric layer formed over first oxide 116. In either of the embodiments shown in FIGS. 4a and 4b, a sacrificial oxide layer 112 is preferably removed with a wet oxide solution preferably comprised of a buffered HF solution.

Figure 5A:
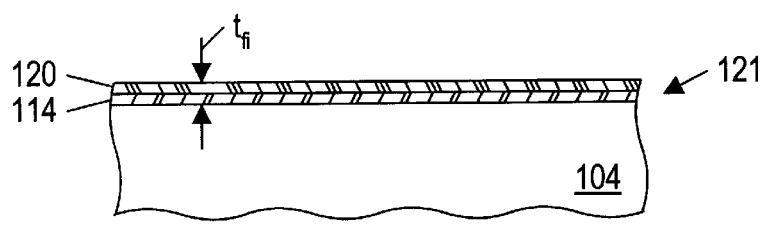
FIG. 5a is a processing step subsequent to FIG. 4a in which a silicon nitride layer has been deposited on the gate oxide layer.
Figure 5B:
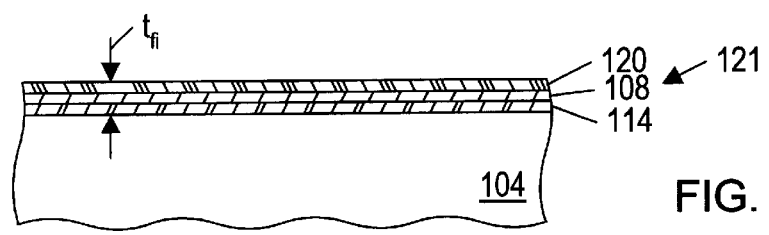
FIG. 5b is a processing step subsequent to FIG. 4b in which silicon nitride layer is deposited on the silicon layer.

Turning now to FIGS. 5a and 5b, alternative embodiments are shown for processing steps subsequent to FIGS. 4a and 4b, respectively. In both embodiments, a silicon nitride film 120 is deposited. In the embodiment shown in FIG. 5a, silicon nitride film 120 is deposited directly upon gate oxide 114 while, in FIG. 5b, silicon nitride film 120 is deposited directly on silicon film 108. In both embodiments, silicon nitride film 120 is preferably deposited in the chemical vapor deposition chamber reactor. Silicon nitride film 120 acts as a barrier to mobile contaminants thereby preventing contaminants from migrating between the gate structure and the substrate channel region of the transistor, thereby beneficially improving the stability and the reliability of the transistor. The gate dielectric 121 comprises the composite of gate oxide 114 and silicon nitride layer 120 in the embodiment shown in FIG. 5a while gate dielectric 121 includes gate oxide 114, silicon layer 108, and silicon nitride layer 120 in the embodiment shown in FIG. 5b. In either embodiment, a film thickness $t_{fi}$ of gate dielectric 121 is less than approximately 100 angstroms. In a still further desirable embodiment, the film thickness $t_{fi}$ is in the range of approximately 10 to 30 angstroms.

Figure 6A:
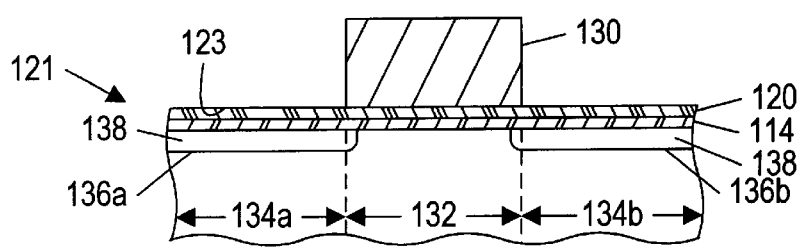
FIG. 6a is a processing step subsequent to FIG. 5a in which a conductive gate and a pair of lightly doped source/drain structures have been formed.

Turning now to FIG. 6a, a conductive gate structure 130 is formed on an upper surface 123 of gate dielectric 121. In the preferred embodiment, conductive gate structure 130 comprises heavily doped polysilicon. For purposes of this disclosure, heavily doped refers to impurity distributions in which the peak impurity concentration exceeds approximately $10^{19}$ atoms/cm$^3$. Conductive gate structures such as conductive gate structure 130 are well known in the field of semiconductor processing and are typically formed by chemically vapor depositing polysilicon upon upper surface 123 of gate dielectric 121. The preferred polysilicon deposition process comprises thermally decomposing silane in a chamber reactor maintained at a temperature less than approximately 650° C. and a pressure less than approximately 2 torr. Subsequent to the formation of conductive gate 130, lightly doped impurity distributions 138 are introduced into a pair of lightly doped source/drain regions 136a and 136b respectively. The lightly doped impurity distributions 136 are laterally disposed on either side of channel region 132 of semiconductor substrate 104. As is well known, preferred methods of introducing impurity distribution 138 into the pair of source/drain regions 136a and 136b include implanting ions of a suitable impurity such as boron, arsenic, or phosphorous. By extension, similar processing is performed in the embodiment shown in FIGS. 4b and 5b but is omitted from the figures. It will be appreciated to those skilled in the art that processing similar to that shown in FIG. 6a will result in the formation of a conductive gate structure and a pair of lightly doped source/drain structures in the embodiment of the present invention disclosed in FIGS. 4b and 5b.

Figure 7A:
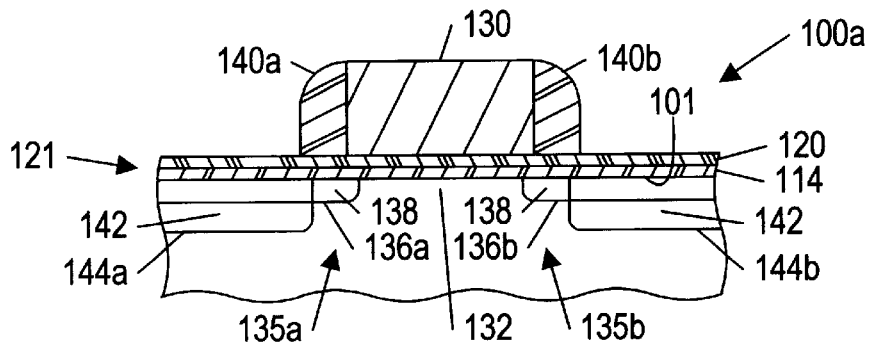
FIG. 7a is a processing step subsequent to FIG. 6a in which spacer structures and heavily doped source/drain structures have been formed.
Figure 8:
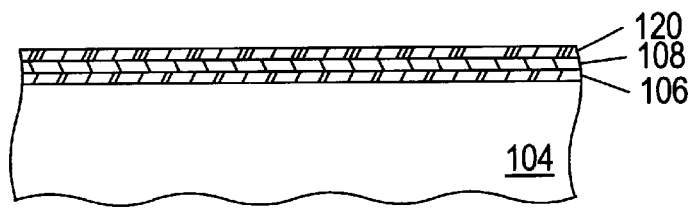
FIG. 8 is an alternative processing step subsequent to FIG. 2 in which a silicon nitride layer has been formed over the silicon layer.
Figure 9:
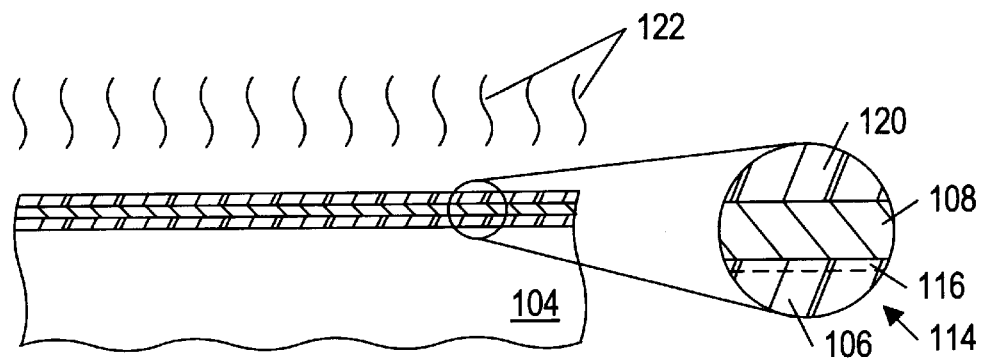
FIG. 9 is a processing step subsequent to FIG. 8 in which the silicon layer is partially oxidized.

Turning now to FIG. 7a, the transistor is substantially completed by forming a pair of spacer structures 140a and 140b on sidewalls of conductive gate structure 130 and thereafter, forming a pair of heavily doped source/drain impurity distributions within heavily doped source/drain regions 144a and 144b. Spacer structures such as spacer structures 140a and 140b are well known in the field of semiconductor processing and are typically fashioned by depositing a conformal dielectric layer such as a low pressure CVD TEOS and thereafter anisotropically etching the deposited dielectric to remove portions of the film from the planar or horizontal regions of the topography. Spacer structures are advantageously incorporated into a two-step source/drain process to displace the heavily doped source/ drain regions from the channel region 132 of semiconductor substrate 104 and thereby reduce the maximum electric field within the channel region 132. In this manner, hot electron effects due to extremely high electric fields found in channel regions of small feature size transistors are reduced or eliminated. Accordingly, FIG. 7a shows a first embodiment of transistor 100a comprising a semiconductor substrate 104, a gate dielectric 121, a conductive gate 130, and a pair of source/drain structures 135a and 135b. Gate dielectric 121 comprises gate oxide layer 114 formed on an upper surface 101 of semiconductor substrate 104 and a gate nitride layer 120 formed above an upper surface of gate oxide layer 114. Conductive gate 130 is formed on an upper surface of gate dielectric layer 121. The pair of source/drain structures 135a and 135b each include a lightly doped impurity distribution 138 and a heavily doped impurity distribution 142. The pair of source/drain structures 135a and 135b are laterally displaced on either side of channel region 132 of semiconductor substrate 104. The preferred thickness of gate dielectric 121 is less than approximately 100 angstroms and is still more preferably in the range of approximately 10 to 30 angstroms. Gate oxide layer 114, in one embodiment, includes a first oxide layer 114 (shown in FIG. 3) formed over a native oxide film 106. In a second embodiment, transistor 100b is substantially similar to first embodiment transistor 100a except that gate dielectric 121 of transistor 100b includes a silicon film 108 formed between a first oxide layer 114 and gate dielectric layer 120. This embodiment of the gate dielectric layer is shown in FIG. 5b.

Figure 10:
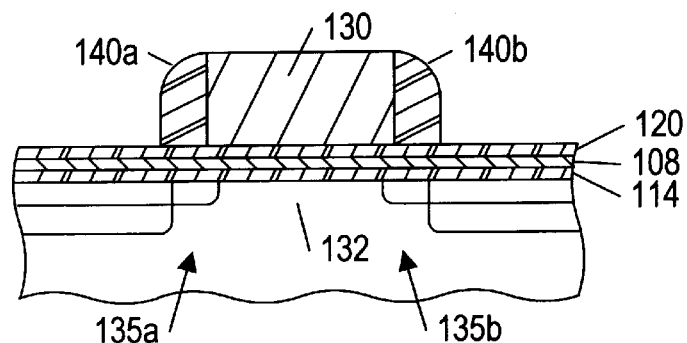
FIG. 10 is a processing step subsequent to FIG. 9 in which a conductive gate and a pair of source/drain structures have been formed.

Turning now to FIGS. 10 through 12, another embodiment of the present invention is shown in which the gate nitride layer 120 is deposited on an upper surface of silicon layer 108 prior to the formation of first oxide film 114. In this embodiment, oxygen within the oxidation chamber ambient is substantially unable to penetrate the silicon nitride layer 120 and therefore the formation of silicon oxide is substantially eliminated from the upper surface of silicon film 108. Oxygen from within native oxide layer 106 may, however, react with the silicon atoms proximal to the interface between silicon film 108 and native oxide film 106 to produce some oxidation of silicon film 108 at its lower surface. The resulting structure is shown in FIG. 11 and comprises silicon nitride layer 120 formed over silicon layer 108 which resides on gate dielectric layer 114. Gate dielectric layer 114 includes a native oxide layer 106 and a first oxide layer 116. In FIG. 12, the process is completed by forming a conductive gate structure 130, a pair of source/drain structures 135a and 135b and a pair of spacer structures 140a and 140b in substantially the same fashion as described previously with respect to FIGS. 6a and 7a. It will be appreciated to those skilled in the art of semiconductor processing that the present invention is capable of producing a highly controllable and ultra thin gate dielectric by substituting a silicon deposition and subsequent oxidation sequence, possibly in combination with a silicon nitride deposition, for the conventional gate oxidation process. It is to be understood that the form of the invention shown is to be taken as a presently preferred embodiment. Various modifications and changes may be made to each and every processing step as would be obvious to a person skilled in the art having the benefit of this disclosure. It is intended that the following claims be interpreted to embrace all such modifications and changes and, accordingly the specification and drawings are to be regarded in an illustrative rather than a restrictive sense.

What is claimed is:

1. A method of forming a transistor comprising:
   providing a semiconductor substrate, wherein an upper region of said semiconductor substrate comprises a native oxide film;
   depositing a silicon film on said native oxide film;
   forming a first oxide film on said native oxide film by thermally oxidizing a portion of said silicon film proximal to said native oxide film, while leaving an unoxidized portion of said silicon film superjacent to said oxidized portion to form a gate dielectric;
   forming a conductive gate on the gate dielectric; and
   forming a pair of source/drain structures within a pair of source/drain regions of said semiconductor substrate, wherein said pair of source/drain structures are laterally displaced on either side of a channel region of said semiconductor substrate.

2. The method of claim 1 wherein said semiconductor substrate comprises single crystal silicon.

3. The method of claim 2, wherein said semiconductor substrate comprises a p-type epitaxial layer formed on a p+ silicon bulk, and wherein a resistivity of said p-type epitaxial layer is in the range of 10 to 15 $\Omega$-cm.

4. The method of claim 1 wherein the step of depositing said silicon film comprises thermally decomposing silane in a chemical vapor deposition reactor maintained at a temperature in the range of approximately 500 to 650° C. and a pressure less than approximately 2 torrs.

5. The method of claim 4 wherein a deposition rate of the step of depositing said silicon film is in the range of approximately 5 to 15 angstroms/minute.

6. The method of claim 4, wherein the depositing for said silicon film is accomplished in a substantially dopant free ambient such that said silicon film comprises undoped silicon.

7. The method of claim 1, further comprising, prior to the step of forming said first oxide film, thinning said silicon layer by removing an upper portion of said silicon layer.

8. The method of claim 7, wherein the step of thinning comprises oxidizing an upper portion of said silicon film to form a sacrificial oxidized film and removing said sacrificial oxidized film with an oxide etch process.

9. The method of claim 1, further comprising, prior to the step of forming said first oxide film, depositing a barrier dielectric on an upper surface of said silicon film wherein the barrier dielectric substantially prevents subsequent oxidation of said silicon film at an interface of said barrier dielectric and said silicon film, and further wherein the gate dielectric comprises said native oxide film, said first oxide film, and said barrier dielectric.

10. The method of claim 9, wherein the step of forming said barrier dielectric comprises depositing silicon nitride.

11. The method of claim 1, further comprising, after the step of forming said first oxide film and prior to the step of forming said conductive gate, depositing a barrier dielectric, wherein the gate dielectric includes said barrier dielectric.

* * * * *